(12) United States Patent
Park et al.

(10) Patent No.: US 8,698,221 B2
(45) Date of Patent: Apr. 15, 2014

(54) CAPACITOR THAT INCLUDES DIELECTRIC LAYER STRUCTURE HAVING PLURAL METAL OXIDES DOPED WITH DIFFERENT IMPURITIES

(75) Inventors: Kiyeon Park, Hwaseong-si (KR); Insang Jeon, Seoul (KR); Hanjin Lim, Seoul (KR); Yeongcheol Lee, Seoul (KR); Jun-Noh Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 213 days.

(21) Appl. No.: 13/290,397

(22) Filed: Nov. 7, 2011

(65) Prior Publication Data

US 2012/0126300 A1 May 24, 2012

(30) Foreign Application Priority Data

Nov. 23, 2010 (KR) .................. 10-2010-0117062

(51) Int. Cl.
*H01L 29/92* (2006.01)

(52) U.S. Cl.
USPC ............. 257/310; 257/532; 257/E29.343

(58) Field of Classification Search
USPC ........................................... 257/535
See application file for complete search history.

(56) References Cited

U.S. PATENT DOCUMENTS

| | | | |
|---|---|---|---|
| 2006/0267066 A1* | 11/2006 | Li et al. ................. | 257/310 |
| 2007/0032013 A1* | 2/2007 | Yoon et al. .............. | 438/240 |
| 2008/0087890 A1* | 4/2008 | Ahn et al. .............. | 257/43 |
| 2009/0309187 A1* | 12/2009 | Choi et al. ............. | 257/532 |
| 2013/0140619 A1* | 6/2013 | Malhotra et al. ....... | 257/306 |

FOREIGN PATENT DOCUMENTS

| | | |
|---|---|---|
| KR | 10-2000-0028681 A | 5/2000 |
| KR | 10-2007-0058939 A | 6/2007 |
| KR | 10-2008-0050989 A | 6/2008 |
| KR | 10-2008-0098824 A | 11/2008 |

* cited by examiner

*Primary Examiner* — Stephen W Smoot
(74) *Attorney, Agent, or Firm* — Lee & Morse, P.C.

(57) ABSTRACT

A capacitor includes a first electrode, a first dielectric layer disposed on the first electrode, the first dielectric layer having a tetragonal crystal structure and including a first metal oxide layer doped with a first impurity, a second dielectric layer disposed on the first metal oxide layer, the second dielectric layer having a tetragonal crystal structure and including a second metal oxide layer doped with a second impurity, and a second electrode disposed on the second dielectric layer. The first dielectric layer has a lower crystallization temperature and a substantially higher dielectric constant than the second dielectric layer.

15 Claims, 12 Drawing Sheets

CAPACITOR THAT INCLUDES DIELECTRIC LAYER STRUCTURE HAVING PLURAL METAL OXIDES DOPED WITH DIFFERENT IMPURITIES

CROSS-REFERENCE TO RELATED APPLICATION

Korean Patent Application No. 10-2010-0117062, filed on Nov. 23, 2010, in the Korean Intellectual Property Office, and entitled, "Capacitors, Semiconductor Devices Including the Same and Methods of Manufacturing the Semiconductor Devices," is incorporated by reference herein in its entirety.

BACKGROUND

Embodiments relate generally to semiconductor devices. More particularly, embodiments relate to a capacitor including a high-k dielectric layer, a semiconductor device including the capacitor, and a method of manufacturing the semiconductor device.

SUMMARY

According to an embodiment, there is provided a capacitor including a first electrode, a first dielectric layer disposed on the first electrode, the first dielectric layer having a tetragonal crystal structure and including a first metal oxide layer doped with a first impurity, a second dielectric layer disposed on the first metal oxide layer, the second dielectric layer having a tetragonal crystal structure and including a second metal oxide layer doped with a second impurity, and a second electrode disposed on the second dielectric layer. The first dielectric layer has a lower crystallization temperature and a higher dielectric constant than the second dielectric layer.

Dielectric constants of the first and second dielectric layers may be substantially higher than that of silicon oxide.

At least one of the first and second dielectric layers may include a portion formed of hafnium oxide.

At least one of the first and second dielectric layers may include a portion formed of zirconium oxide.

At least one of the first and second dielectric layers may include a portion formed of a mixture of hafnium oxide and zirconium oxide.

Each of the first and second impurities may include one of silicon (Si), carbon (C), germanium (Ge), tin (Sn), titanium (Ti), and cesium (Ce).

A thickness of the second dielectric layer may be in a range of about 5 Å to about 25 Å.

A ratio in thickness of the first dielectric layer to the second dielectric layer may be about 3:1.

According to an embodiment, there is provided a semiconductor device including the capacitor, a transistor disposed on a substrate, the transistor including a first doped region and a second doped region, a bit line electrically connected to the first doped region, and a capacitor electrically connected to the second doped region. The capacitor may include a lower electrode, a first dielectric layer disposed on the lower electrode, a second dielectric layer disposed on the first dielectric layer, and an upper electrode. The first dielectric layer has a tetragonal crystal structure and comprises a first metal oxide layer doped with a first impurity, the second dielectric layer has a tetragonal crystal structure and comprises a second metal oxide layer doped with a second impurity, and the first dielectric layer has a lower crystallization temperature and a higher dielectric constant than the second dielectric layer.

The first impurity may include germanium, the second impurity may include silicon, and the second dielectric layer may suppress a diffusion of the first impurity toward the second electrode.

According to an embodiment, there is provided a method of fabricating a semiconductor device, including forming a first electrode on a substrate provided with a lower structure, forming a preliminary first dielectric layer on the first electrode, doping the preliminary first dielectric layer with a first impurity to form a first dielectric layer having a tetragonal crystal structure, forming a preliminary second dielectric layer on the first dielectric layer, doping the preliminary second dielectric layer with a second impurity to form a second dielectric layer having a tetragonal crystal structure; and forming a second electrode on the second dielectric layer.

The doping of the preliminary first dielectric layer may be performed during the forming of the preliminary first dielectric layer, and the forming of the preliminary first dielectric layer and the doping of the preliminary first dielectric layer may be performed using an atomic layer deposition technique.

The doping of the preliminary second dielectric layer may be performed during the forming of the preliminary second dielectric layer, and the forming of the preliminary second dielectric layer and the doping of the preliminary second dielectric layer may be performed using an atomic layer deposition technique.

According to an embodiment, there is provided a capacitor including a first electrode and a second electrode facing each other, and a dielectric layer structure interposed between the first and second electrodes, the dielectric layer structure including metal oxides doped with different impurities, the metal oxides having different dielectric constants from each other and different crystallization temperatures from each other.

The dielectric layer structure may include a first dielectric layer that includes hafnium oxide, zirconium oxide or a mixture thereof, and is doped with germanium, and a second dielectric layer that hafnium oxide, zirconium oxide or a mixture thereof, and is doped with silicon A doping amount of germanium in the first dielectric layer may be about 20-25 atomic percent.

A thickness of the second dielectric layer may be in a range of about 5 Å to about 25 Å.

A ratio in thickness of the first dielectric layer to the second dielectric layer may be about 3:1.

The first dielectric layer and the second dielectric layer may have a predominantly tetragonal crystal structure.

BRIEF DESCRIPTION OF THE DRAWINGS

The accompanying drawings are included to provide a further understanding of the exemplary embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In contrast, when an element is referred to as being "directly on" another element, there are no intervening elements present. Further, it will be understood that when a layer is referred to as being "between" two layers, it can be the only layer between the two layers, or one or more intervening layers may also be present. Like reference numerals refer to like elements throughout.

It will be understood that when an element is referred to as being "connected" to another element, it can be directly connected to the other element or intervening elements may be present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Semiconductor Device]

Figure 1:
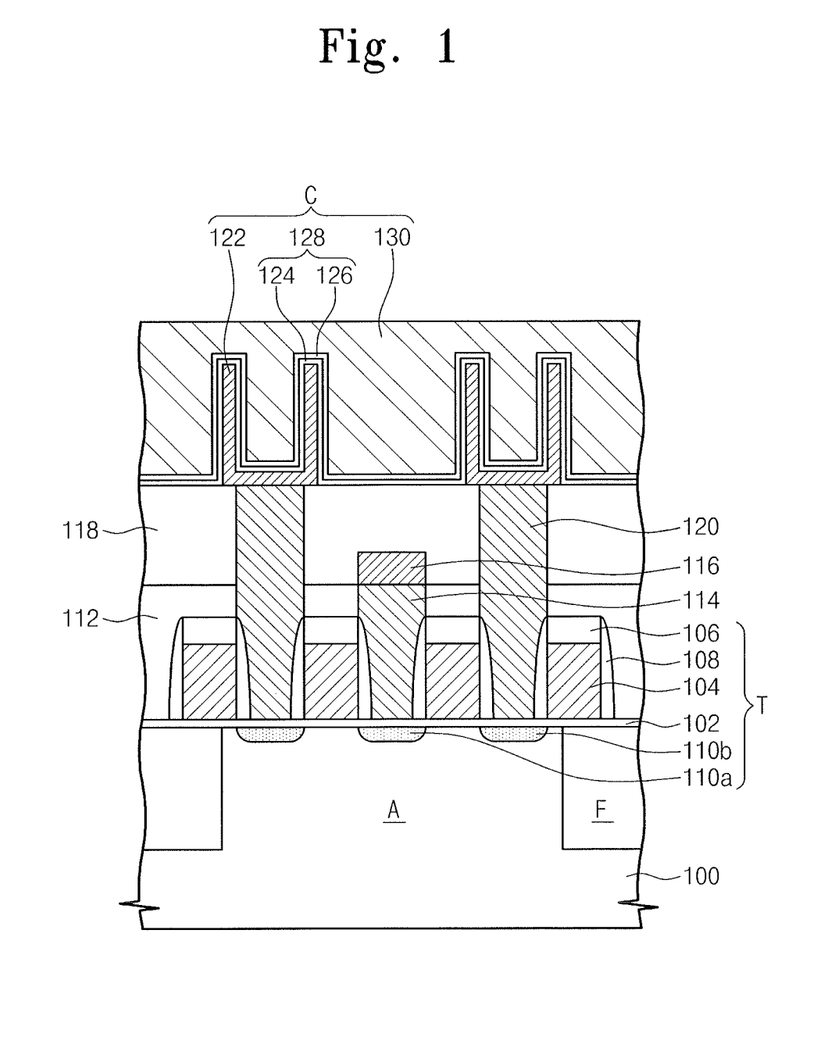
FIG. 1 illustrates a sectional view of a semiconductor device according to example embodiments.

FIG. 1 illustrates a sectional view of a semiconductor device according to example embodiments. Referring to FIG. 1, the semiconductor device may include a substrate 100, a transistor T, a bit line 116, and a capacitor C.

The substrate 100 may include an active region A and a field isolation region F. The field isolation region F may be formed using a shallow trench isolation process. The active region A may be confined by the field isolation region F. The active region A may extend along a first direction.

The transistor T may include a gate insulating layer 102, a gate electrode 104, a first doped region 110a, and a second doped region 110b. The gate insulating layer 102 may include at least one dielectric layer; for example, the gate insulating layer 102 may include a silicon oxide layer or a metal oxide layer. The gate electrode 104 may extend along a second direction, which is not parallel to the first direction. The gate electrode 104 may include at least one conductive layer; for example, the gate electrode 104 may include at least one of a doped silicon layer, a metal layer, or a metal compound layer. In addition, a mask 106 may be disposed on the gate electrode 104. The mask 106 may include a nitride layer (e.g., a silicon nitride layer). Moreover, spacers 108 may be disposed on both sidewalls of the gate electrode 104, additionally. The spacer 108 may include a nitride layer (e.g., a silicon nitride layer). The first and second doped regions 110a and 110b may be formed vertically in a top surface of the substrate 100 and horizontally at both sides of the gate electrode 104. The first and second doped regions 110a and 110b may serve as source and drain electrodes.

Meanwhile, to provide better understanding of example embodiments, a planar type transistor is exemplarily illustrated in FIG. 1, but example embodiments are not limited thereto. For example, the transistor T may be formed to have a buried channel array transistor (BCAT) structure having a buried channel region or a vertical channel array transistor (VCAT) structure having a pillar shaped active region.

The bit line 116 may be electrically connected to the first doped region 110a of the transistor T. The bit line 116 and the transistor T may be electrically and spatially separated by a first interlayer dielectric layer 112. To connect electrically the bit line 116 with the first doped region 110a, a first contact plug 114 may be disposed between the bit line 116 and the first doped region 110a. The first contact plug 114 may be formed to penetrate the first interlayer dielectric layer 112.

The bit line 116 may extend along a third direction, which may be perpendicular to the second direction. Moreover, the first direction may be non-parallel with respect to both the second and third directions. The bit line 116 may include at least one conductive layer; for example, the bit line 116 may include at least one of a doped silicon layer, a metal layer, and a metal compound layer. Furthermore, the bit line 116 may have a multi-layered structure including at least two of the doped silicon layer, the metal layer, and the metal compound layer.

The capacitor C may be electrically connected to the second doped region 110b. The capacitor C and the bit line 116 may be electrically and spatially separated by a second interlayer dielectric 118. And, the capacitor C and the transistor T may be electrically and spatially separated by the first interlayer dielectric 112 and second interlayer dielectric 118. To connect electrically the capacitor C with the second doped region 110b, a second contact plug 120 may be disposed between the capacitor C and the second doped region 110b. The second contact plug 120 may be formed to penetrate the first interlayer dielectric layer 112 and the second interlayer dielectric layer 118.

The capacitor C may include a lower electrode 122, a dielectric layer structure 128, and an upper electrode 130. The lower electrode 122 may include at least one conductive layer; for example, the lower electrode 122 may include at least one of a doped silicon layer, a metal layer, or a metal compound layer. The upper electrode 130 may also include at least one conductive layer; for example, the upper electrode 130 may include at least one of a doped silicon layer, a metal layer, or a metal compound layer. In certain embodiments, the upper electrode 130 may be formed of the same material as the lower electrode 122. The dielectric layer structure 128 may be disposed between the lower electrode 122 and the upper electrode 130.

The lower electrode 122 may have a cup shape or a bottom-closed cylinder shape, as shown in FIG. 1. However, it should be noted that the lower electrode 122 of FIG. 1 is illustrated for better understanding of example embodiments and example embodiments are not limited thereto. That is, the capacitor C may be formed in various structures; for example, the capacitor C may have a planar or concave structure including the lower electrode 122, the dielectric layer structure 128, and the upper electrode 130 sequentially stacked.

The dielectric layer structure 128 may include a first dielectric layer 124 disposed on the lower electrode 122 and a second dielectric layer 126 disposed on the first dielectric layer 124.

The first dielectric layer 124 may include a first metal oxide doped with a first impurity. According to some embodiments, the first impurity may be at least one selected from a group of silicon, titanium, germanium, tin, cesium, and carbon. The first metal oxide may have a monoclinic crystal structure and/or a tetragonal crystal structure. Moreover, the first metal oxide may be formed of hafnium oxide ($HfO_x$), zirconium oxide ($ZrO_x$), or a mixture thereof. For example, in some embodiments, the first metal oxide may be formed of undoped hafnium oxide. In this case, the first metal oxide may have the monoclinic crystal structure when annealed at a temperature of about 1,300° C. or less and the tetragonal crystal structure when annealed at a temperature of about 1,300° C. or more. In other embodiments, the first metal oxide may be formed of hafnium oxide doped with the first impurity, and in this case, the first metal oxide may have the tetragonal crystal structure, even when it is annealed at a temperature of about 1,300° C. or less. That is, the first metal oxide doped with the first impurity may have a stabilized tetragonal crystal structure at a low temperature.

The second dielectric layer 126 may include a second metal oxide doped with a second impurity. According to some embodiments, the second impurity may be at least one of silicon, titanium, germanium, tin, cesium, and carbon. The second metal oxide may have a monoclinic crystal structure and/or a tetragonal crystal structure. For example, the second metal oxide may be formed of hafnium oxide ($HfO_x$), zirconium oxide ($ZrO_x$), or a mixture thereof.

The first dielectric layer 124 may have substantially a lower crystallization temperature than the second dielectric layer 126. According to some embodiments, the first impurity of about 20 to about 25 atomic percent may participate in the crystallization of the first dielectric layer 124. In addition, according to some embodiments, the first dielectric layer 124 may have substantially a greater dielectric constant than the second dielectric layer 126.

The second dielectric layer 126 may prevent the first impurity in the first dielectric layer 124 disposed thereunder from diffusing into the upper electrode 130. A thickness of the second dielectric layer 126 may be in a range of about 5 Å to about 25 Å. If the thickness of the second dielectric layer 126 were to be less than about 5 Å, the first impurity may not be sufficiently prevented from diffusing into the upper electrode 130. If the thickness of the second dielectric layer 126 were to be more than about 25 Å, the dielectric layer structure 128 may exhibit a deteriorated equivalent oxide thickness (EOT) property, because the second dielectric layer 126 having a lower dielectric constant than the first dielectric layer 124 would account for a large portion of EOT of the dielectric layer structure 128.

According to some embodiments, the first dielectric layer 124 may have a greater thickness than the second dielectric layer 126. In this case, the first dielectric layer 124 having a higher dielectric constant can account for a large portion of the dielectric layer structure 128 in terms of thickness, and thus, the dielectric layer structure 128 can have an increased EOT. For example, in the dielectric layer structure 128, the ratio in thickness of the first dielectric layer 124 to the second dielectric layer 126 may be about 3:1.

Hereinafter, materials for the first and second dielectric layers 124 and 126 will be described in further detail.

The first dielectric layer 124 may include the first metal oxide doped with germanium. The first metal oxide may be a mixture of hafnium oxide and zirconium oxide. According to some embodiments, the first dielectric layer 124 may include one of a hafnium oxide layer, a zirconium oxide layer, and a germanium oxide layer. The first dielectric layer 124 may include portions having the tetragonal crystal structure and the monoclinic crystal structure, where portions having the tetragonal crystal structure may be substantially more abundant compared with other portions having the monoclinic crystal structure. Moreover, the first dielectric layer 124 may have a crystallization temperature of about 400° C. and a relative dielectric constant of about 45.

The second dielectric layer 126 may include the second metal oxide doped with silicon. The second metal oxide may be a mixture of hafnium oxide and zirconium oxide. According to some embodiments, the second dielectric layer 126 may include one of a hafnium oxide layer, a zirconium oxide layer, and a silicon oxide layer. The second dielectric layer 126 may include portions having the tetragonal crystal structure and the monoclinic crystal structure, where portions having the tetragonal crystal structure may be substantially more abundant compared with other portions having the monoclinic crystal structure.

For the second metal oxide doped with silicon, an electric property of the second dielectric layer 126 may strongly depend on the concentration of silicon. For example, when the concentration of silicon in the second dielectric layer 126 is excessively low, a leakage current may occur at second dielectric layer 126. On the other hand, when a concentration of silicon in the second dielectric layer 126 is excessively high, the second dielectric layer 126 may have an amorphous structure and its dielectric constant may decrease. For example, if the second dielectric layer 126 were to have an amorphous structure, the dielectric constant thereof may be reduced by half. In this case, the capacitor C may have a reduced capacitance, and a concentration margin, which refers to a dependency of an electric property of a target layer on an impurity concentration, may become narrow.

By contrast, for the first metal oxide doped with germanium, the concentration margin may be relatively wide compared with the second metal oxide doped with silicon. In addition, the first dielectric layer 124 doped with germanium may have a crystallization temperature of about 400° C., which is lower by about 50° C. than that of the second dielectric layer 126 doped with silicon. As a result, a crystallization degree of the first dielectric layer 124 doped with germanium may show an increase compared with the second dielectric layer 126 using silicon as the impurity, while it may depend on for a germanium concentration. For example, a crystallization degree of the first dielectric layer 124 doped with germanium may show a two-fold increase than when compared with the second dielectric layer 126.

After crystallizing the first dielectric layer 124, the germanium in a doping amount of about 20 to about 25 atomic percent therein may participate in maintaining the crystallized structure. Due to this crystallization property, the first dielectric layer 124 doped with germanium may have a higher dielectric constant increased by about 10-15% (i.e., about 40-45) than the second dielectric layer 126 doped with silicon. That is, an EOT property of the dielectric layer structure 128 can be improved by using the first dielectric layer 124 doped with germanium.

Meanwhile, the first dielectric layer 124 doped with germanium may exhibit a lower heat-resistant property than the second dielectric layer 126 using silicon. In more detail, at a temperature of about 400° C., germanium dioxide may be decomposed into germanium monoxide and may be desorbed from the first dielectric layer 124. Furthermore, at a temperature of about 430° C., germanium dioxide may be completely removed from the first dielectric layer 124 by the desorption process. The decomposed germanium monoxide may be in a solid or gas phase. The decomposition of germanium dioxide may be described by the following reaction formula (1).

$$GeO_2 + Ge \rightarrow 2GeO \text{ (at } 430° \text{ C.)} \tag{1}$$

In addition, the germanium in the first dielectric layer 124 may have a thermal diffusion property, which allows germanium elements to diffuse toward the upper electrode 130. This will be described in further detail with reference to FIGS. 3A through 3C.

According to some embodiments, the first dielectric layer 124 including the germanium elements may be disposed on the lower electrode 122 to increase capacitance of the capacitor C and decrease the leakage current. In addition, a crystallization performance can be improved by the first dielectric layer 124 including the germanium elements. Moreover, the second dielectric layer 126 including the silicon elements may be disposed on the first dielectric layer 124 to prevent the germanium elements in the first dielectric layer 124 from diffusing to the upper electrode 130. In certain embodiments, a thickness of second dielectric layer 126 may be in a range of about 5 Å to about 25 Å, and the ratio in thickness of the first dielectric layer 124 to the second dielectric layer 126 may be about 3:1.

According to some modified embodiments, the first and second impurities may be other elements selected to complement properties of the first and second dielectric layers 124 and 126 each other. For example, the first and second impurities may be at least one of titanium, tin, cesium, or carbon.

[Method of Fabricating the Capacitor]

FIGS. 2A through 2D illustrate cross-sectional views of a method of fabricating a capacitor according to some embodiments. The capacitor C of FIG. 1 may be fabricated by methods described with reference to FIGS. 2A through 2D.

Figure 2A:
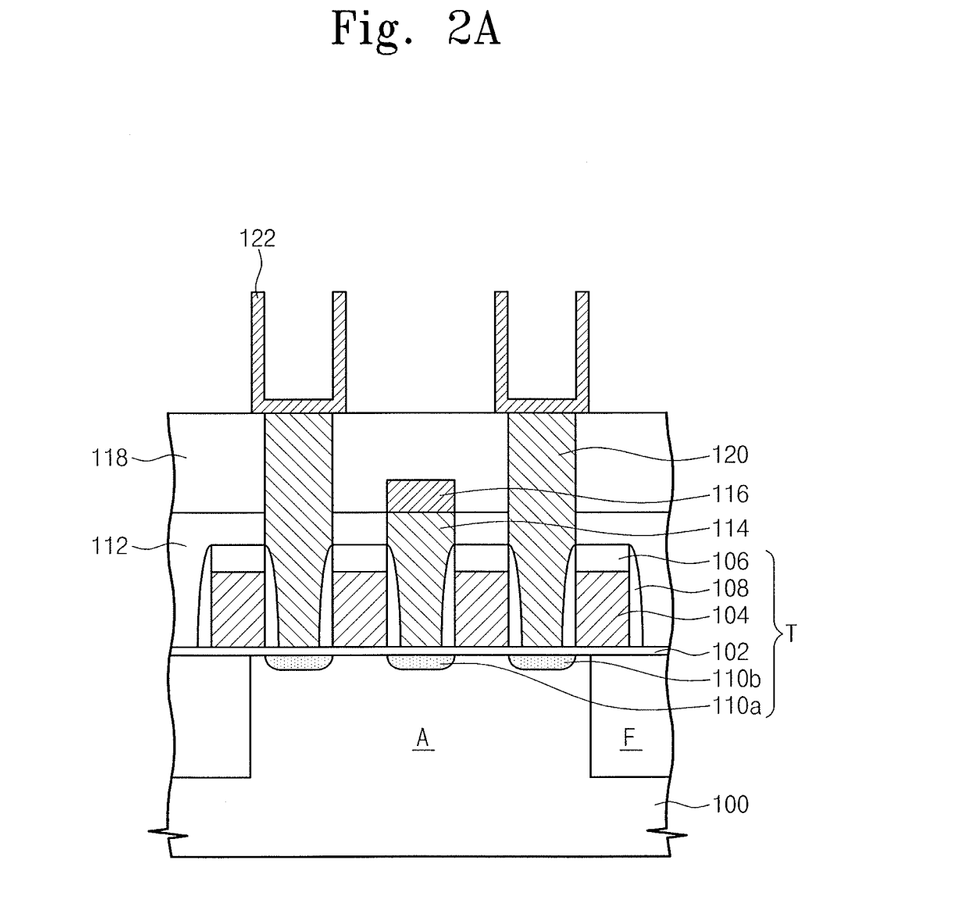
FIGS. 2A through 2D illustrate cross-sectional, sequential views of a method of fabricating a capacitor according to some embodiments.

Referring to FIG. 2A, a lower electrode 122 may be formed on a substrate 100 provided with a lower structure.

The lower structure may include a transistor T, a first contact plug 114, a bit line 116, and a second contact plug 120. In addition, a first interlayer dielectric 112 may be disposed between the transistor T and the bit line 116 to separate electrically and spatially them, and a second interlayer dielectric 118 may be disposed between the bit line 116 and the lower electrode 122 to separate electrically and spatially them. The lower electrode 122 may be electrically connected to the second contact plug 120.

The formation of the lower electrode 122 may include forming a first sacrificial layer (not shown) on the second interlayer dielectric 118. Here, the first sacrificial layer may be formed to define an opening exposing the second contact plug 120. The first sacrificial layer may include a photoresist layer or an oxide layer. Next, a first conductive layer (not shown) may be conformally formed on the first sacrificial layer. For example, the first conductive layer may be formed such that the opening is not filled, thereby covering conformally an exposed surface of the first sacrificial layer. Thereafter, a second sacrificial layer (not shown) may be formed to fill the opening provided with the first conductive layer. The second sacrificial layer may include substantially the same material as the first sacrificial layer. For example, the second sacrificial layer may also include a photoresist layer or an oxide layer. Next, a node separation process may be performed to form the lower electrode 122 confined within the opening. The node separation process may include etching the first conductive layer to expose a top surface of the first sacrificial layer. After the formation of the lower electrode 122, the first and second sacrificial layers may be removed.

Figure 2B:
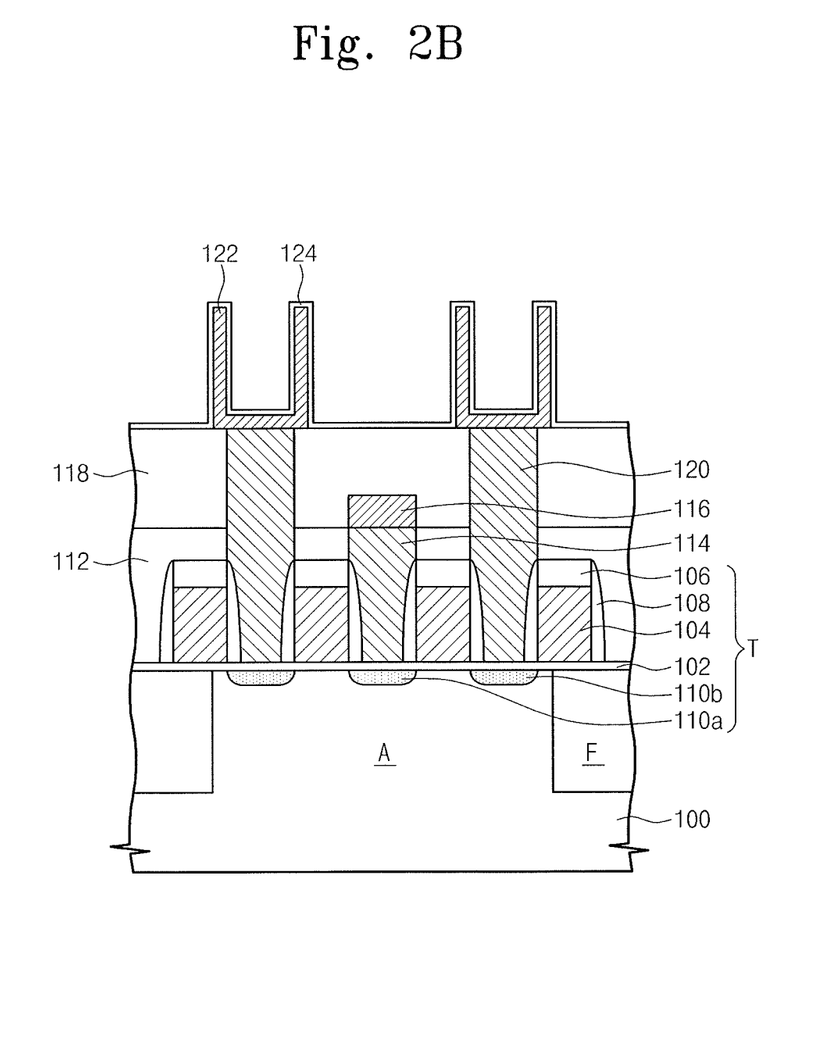

Referring to FIG. 2B, a first dielectric layer 124 may be conformally formed on the lower electrode 122. The first dielectric layer 124 may be formed such that an internal space of the lower electrode 122 is not filled and may cover conformally an exposed surface of the lower electrode 122. The first dielectric layer 124 may include a first metal oxide doped with germanium.

The formation of the first dielectric layer 124 may include forming a preliminary first metal oxide. The preliminary first metal oxide may be formed of zirconium oxide or a mixture of hafnium oxide and zirconium oxide. For example, the preliminary first metal oxide may include a hafnium oxide layer having a monoclinic crystal structure. Moreover, the preliminary first metal oxide may be formed of at least one of materials having substantially a greater dielectric constant than silicon oxide. The preliminary first metal oxide may be formed using an atomic layer deposition (ALD) process. The first dielectric layer 124 may be formed by doping the preliminary first metal oxide with germanium.

According to some embodiments, the process of doping the preliminary first metal oxide with germanium may be performed during the formation of the preliminary first metal oxide. For example, during the ALD process for forming the preliminary first metal oxide, a source gas including germanium elements may be supplied on the preliminary first metal oxide. In detail, the ALD process may include a cycle of supplying a first source gas including hafnium or zirconium, purging the first source gas, supplying a second source gas including oxygen, purging the second source gas, supplying a third source gas including germanium, and purging the third source gas, such that the preliminary first metal oxide and the first dielectric layer 124 may be formed in the same process.

Figure 2C:
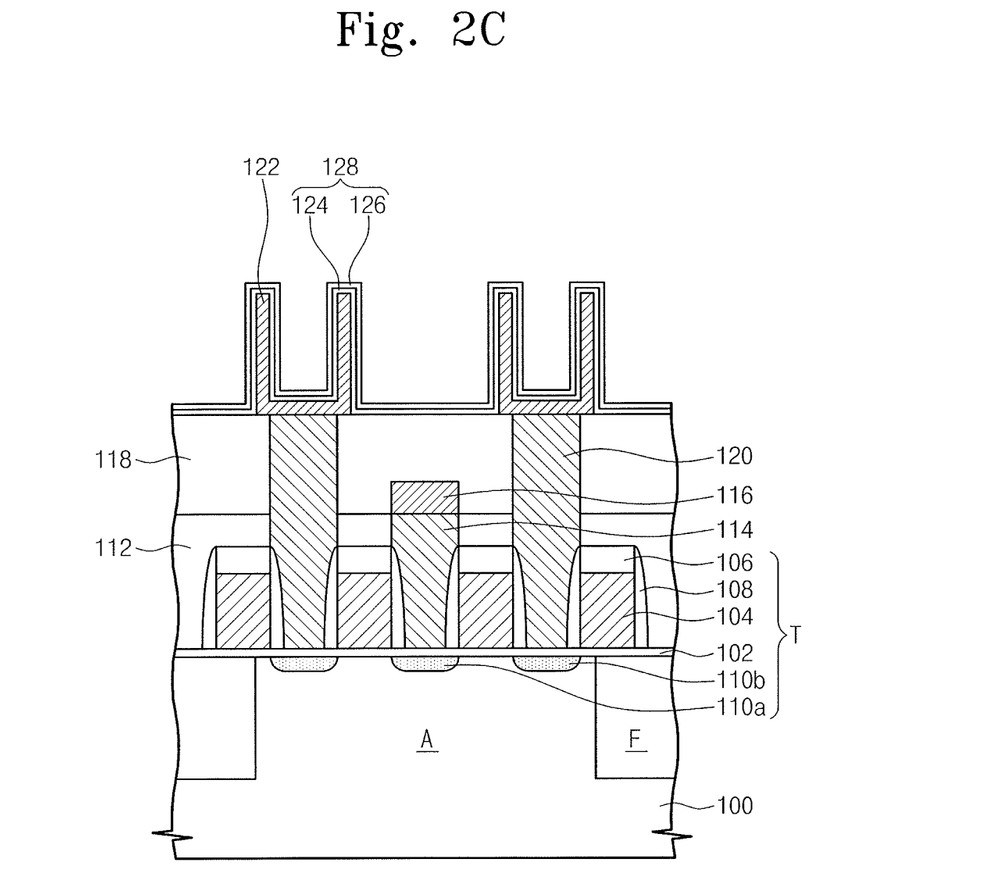

Referring to FIG. 2C, a second dielectric layer 126 may be conformally formed on the first dielectric layer 124. The second dielectric layer 126 may be formed such that the internal space of the lower electrode 122 provided with the first dielectric layer 124 is not filled and may cover conformally an exposed surface of the first dielectric layer 124. The second dielectric layer 126 may include a second metal oxide doped with silicon.

The formation of the second dielectric layer 126 may include forming a preliminary second metal oxide. The preliminary second metal oxide may be formed of zirconium oxide or a mixture of hafnium oxide and zirconium oxide. For example, the preliminary second metal oxide may include a hafnium oxide layer having a monoclinic crystal structure. Moreover, the preliminary second metal oxide may be formed of at least one of materials having substantially a greater dielectric constant than silicon oxide. The preliminary second metal oxide may be formed using an atomic layer deposition (ALD) process. The second dielectric layer 126 may be formed by doping the preliminary second metal oxide with silicon.

According to some embodiments, the process of doping the preliminary second metal oxide with silicon may be performed during the formation of the preliminary second metal oxide. For example, during the ALD process for forming the preliminary second metal oxide, a source gas including silicon elements may be supplied on the preliminary second metal oxide. In detail, the ALD process may include a cycle of supplying a first source gas including hafnium or zirconium, purging the first source gas, supplying a second source gas including oxygen, purging the second source gas, supplying a third source gas including silicon, and purging the third source gas, such that the preliminary second metal oxide and the second dielectric layer 126 may be formed in the same process.

The ratio in thickness of the first dielectric layer 124 to the second dielectric layer 126 may be about 3:1, and a thickness of second dielectric layer 126 may be in a range of about 5 Å to about 25 Å.

The first and second dielectric layers 124 and 126 may constitute a dielectric layer structure 128. That is, the dielectric layer structure 128 may include the first dielectric layer 124 having a higher dielectric constant and a lower crystallization temperature than the second dielectric layer 126 and the second dielectric layer 126 suppressing a diffusion of germanium in the first dielectric layer 124. As a result, the capacitor C including the dielectric layer structure 128 can have a reduced leakage current and an increased capacitance.

Figure 2D:
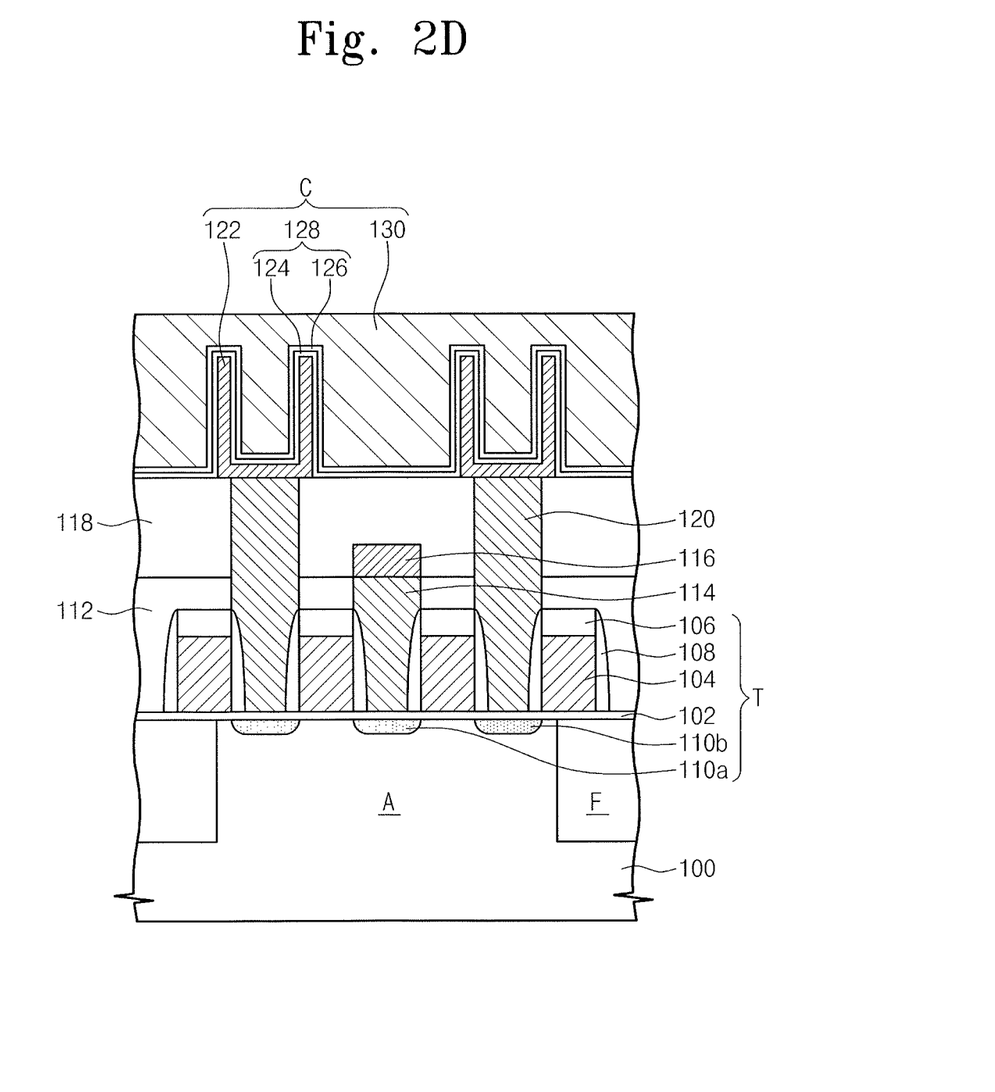

Referring to FIG. 2D, an upper electrode 130 may be formed on the dielectric layer structure 128. The upper electrode 130 may fill the internal space of the lower electrode 122 provided with the dielectric layer structure 128. The upper electrode 130 may include at least one of a doped silicon layer, a metal layer, or a metal compound layer. For example, the upper electrode 130 may be formed of the same material as the lower electrode 122

[Experiments]

Figure 3A:
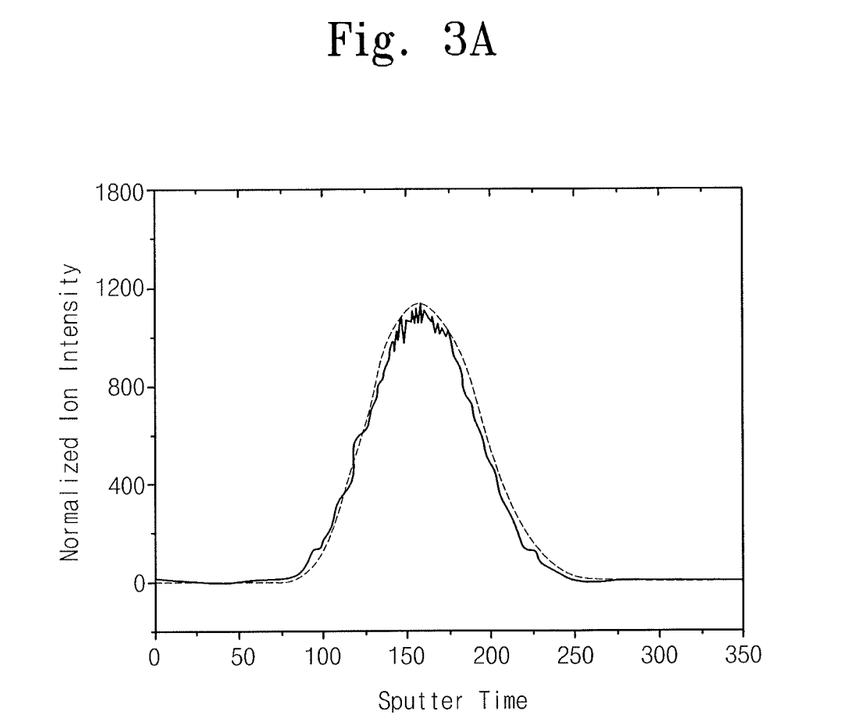
FIGS. 3A through 3C illustrate graphs showing the relation between concentration and diffusivity of germanium doped in a capacitor dielectric layer.
Figure 3B:
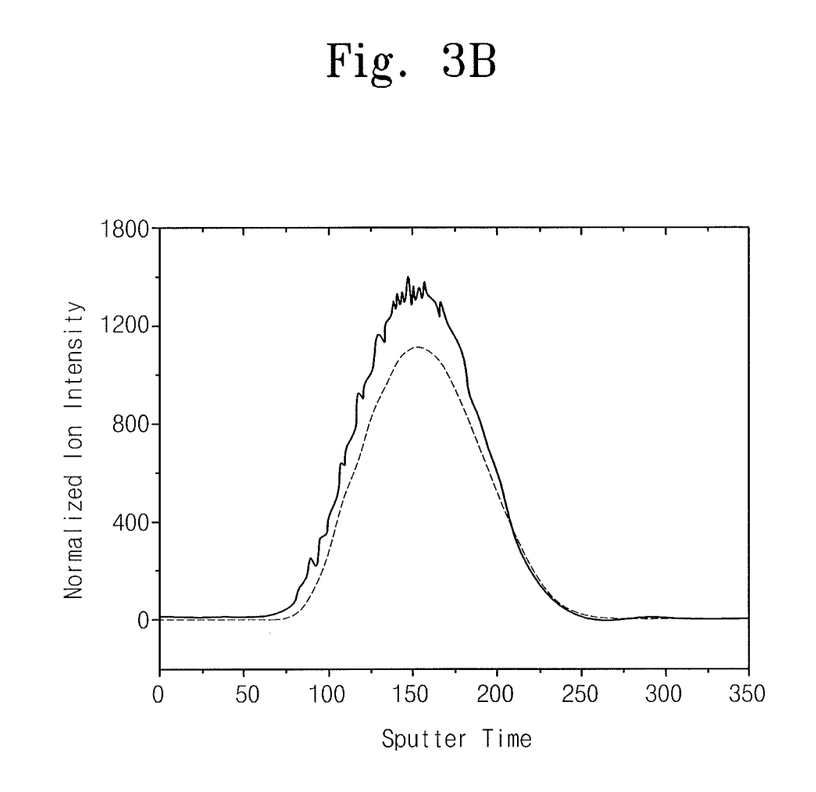
Figure 3C:
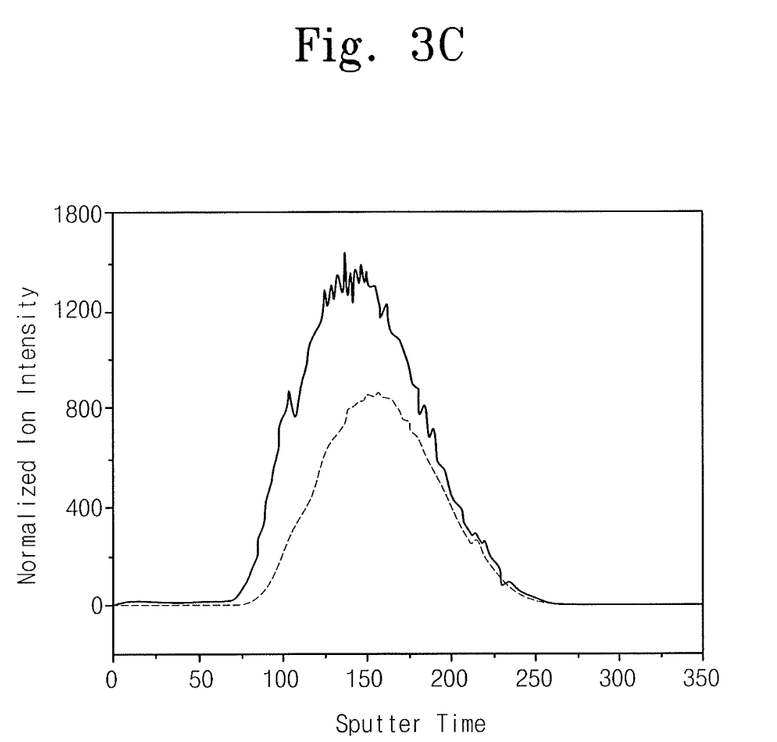

FIGS. 3A through 3C are graphs showing the relation between concentration and diffusivity of germanium doped in a capacitor dielectric layer.

In the experiment, a capacitor C including an upper electrode, a capacitor dielectric layer and a lower electrode was prepared, and the upper electrode, the first dielectric layer and the lower electrode were sequentially etched using a sputtering etching method. In the graphs of FIGS. 3A through 3C, the horizontal and vertical axes denote a sputter time in seconds and a normalized ion intensity measured in the sputtering etching, respectively.

In FIGS. 3A through 3C, the dotted curves denote results measured from samples having a mixture of undoped zirconium oxide and undoped hafnium oxide as the capacitor dielectric layer. The solid curves denote results measured from another samples having a mixture of germanium-doped zirconium oxide and germanium-doped hafnium oxide as the capacitor dielectric layer. Here, the samples for the solid curves of FIGS. 3A through 3C had germanium concentrations of about 4.5%, about 7.7%, and about 14.5%, respectively.

Referring to FIGS. 3A through 3C, a boundary of the capacitor dielectric layer is shown by a region having non-vanishing y-value. That is, the starting point of the non-vanishing region represents the upper interface between the capacitor dielectric layer and the upper electrode, and the end point of the non-vanishing region represents the lower interface between the capacitor dielectric layer and the lower electrode.

From the solid curves, the higher the germanium concentration was, the nearer the starting point was positioned to the upper electrode 130. That is, it is shown that an increase in the concentration of germanium doped in the capacitor dielectric layer raises an amount of germanium diffused into the upper electrode.

Figure 4A:
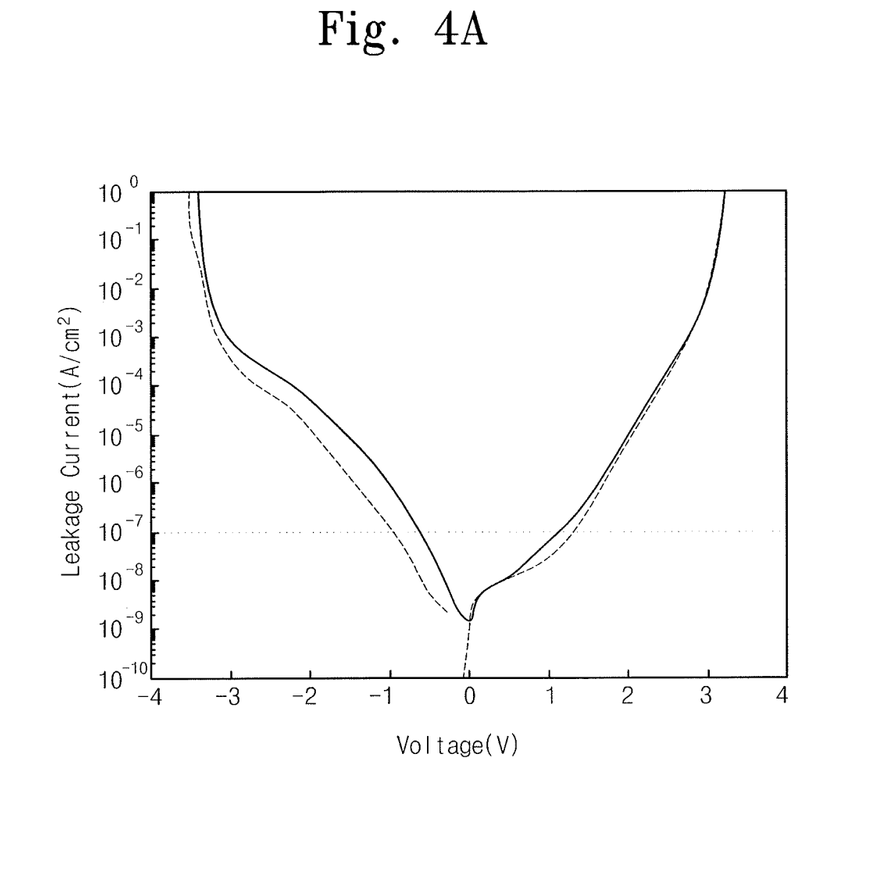
FIGS. 4A and 4B illustrate graphs showing a leakage current characteristic of a capacitor dielectric layer according to some embodiments.
Figure 4B:
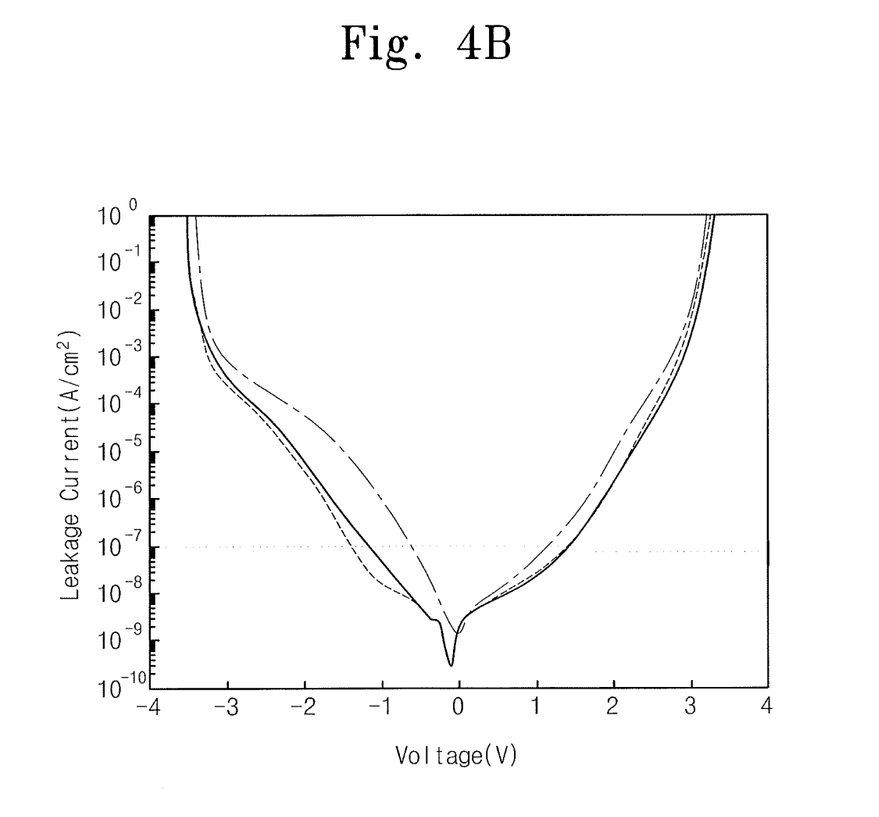

FIGS. 4A and 4B are graphs showing a leakage current characteristic of a capacitor dielectric layer according to some embodiments. In the graphs of FIGS. 4A and 4B, the horizontal and vertical axes denote a voltage [V] applied to a capacitor and a leakage current [$A/cm^2$] of the capacitor, respectively.

In FIG. 4A, all the dotted and solid curves represent results measured from samples having a mixture of germanium-doped zirconium oxide and germanium-doped hafnium oxide as the capacitor dielectric layer. However, the sample for the dotted curve was prepared without any thermal treatment, and the sample for the solid curve was annealed at a temperature of about 550° C. using a rapid thermal process.

Referring to FIG. 4A, a leakage current of the annealed sample (i.e., in the solid curve) increased in a negative voltage region. For example, the non-annealed sample showed a leakage current of about $10^{-7}$ A/cm$^2$ at +1.60V and −0.99V, and the annealed sample showed a leakage current of about $10^{-7}$ A/cm$^2$ at +1.14V and −0.62V.

That is, it can be seen that a metal oxide layer doped with germanium (e.g., the first dielectric layer 124) may exhibit deterioration in a heat-resistant property. However, according to example embodiments, as will be explained with reference to FIG. 4B, this deterioration in a heat-resistant property can be overcome by a thin silicon-doped metal oxide layer (e.g., the second dielectric layer 126) formed on the germanium-doped metal oxide layer.

In FIG. 4B, all the dotted and solid curves represent results measured from samples having a capacitor dielectric layer consisting of a first capacitor dielectric layer and a second capacitor dielectric layer stacked sequentially. Here, the first capacitor dielectric layer was a mixture of germanium-doped zirconium oxide and germanium-doped hafnium oxide, and the second capacitor dielectric layer was a mixture of silicon-doped zirconium oxide and silicon-doped hafnium oxide. Meanwhile, the sample for the dotted curve (hereinafter, first sample) was prepared without any thermal treatment, and the sample for the solid curve (hereinafter, second sample) was annealed at a temperature of about 550° C. using a rapid thermal process. In this sense, it can be said that the dielectric layer structure 128 according to example embodiments may exhibit a leakage current characteristic, shown by the solid curve, of the second sample.

Furthermore, in FIG. 4B, the alternating long and short dashed curve represents a result measured from a sample (hereinafter, third sample) having a mixture of germanium-doped zirconium oxide and germanium-doped hafnium oxide as the capacitor dielectric layer. The third sample was annealed at a temperature of about 550° C. using a rapid thermal process.

Referring to FIG. 4B, the first sample having both the non-annealed first and second capacitor dielectric layers (i.e., the dotted line) exhibited a leakage current characteristic similar to the second sample having both the annealed first and second capacitor dielectric layers (i.e., the solid line). For example, a leakage current of the first sample was about $10^{-7}$ A/cm$^2$ at +1.43V and −1.41V, and a leakage current of the second sample was about $10^{-7}$ A/cm$^2$ at +1.39V and −1.17V.

By contrast, the third sample exhibited deterioration in a leakage current characteristic, compared with the first and second samples. Especially, the deterioration exhibited clearly in a negative voltage region. For example, a leakage current of the third sample was about $10^{-7}$ A/cm$^2$ at +1.14V and −0.62V.

In conclusion, in the case that the capacitor dielectric layer has the germanium-doped and silicon-doped metal oxide layers stacked sequentially, the capacitor can have an improved leakage current characteristic, even if it is annealed at a temperature of about 550° C. That is, it can be said that the aforementioned deterioration in a heat-resistant property can be overcome by using the capacitor dielectric layer having the germanium-doped and silicon-doped metal oxide layers stacked sequentially.

[Applications]

Figure 5A:
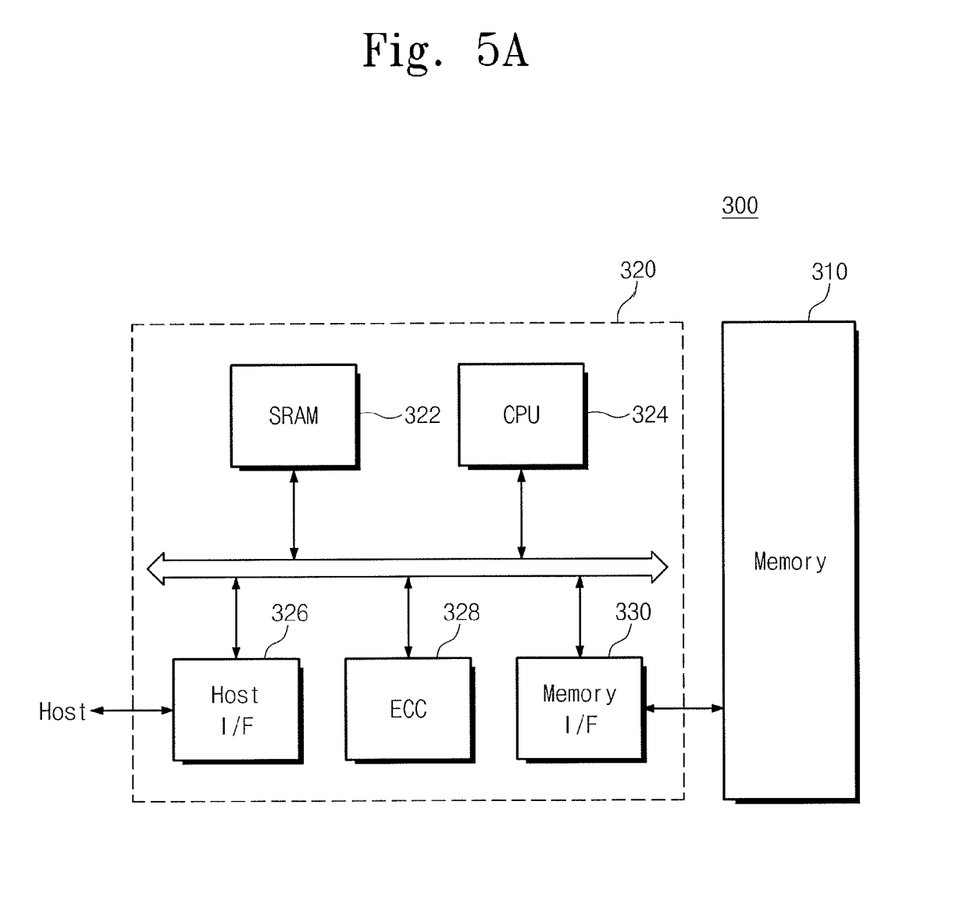
FIG. 5A illustrate a block diagram of a memory card including a memory device according to the exemplary embodiments.

FIG. 5A is a block diagram illustrating a memory card including a memory device according to the exemplary embodiments. Referring to FIG. 5A, a semiconductor device according to exemplary embodiments may be applied to form a memory card 300. For example, the memory card 300 may include a memory controller 320 to control a data exchange between a host and a semiconductor memory 310. A static random access memory (SRAM) 322 may be used as an operation memory of a central processing unit (CPU) 324. A host interface (HOST I/F) 326 may include at least one data exchange protocol of the host connected to the memory card 300. An error correction code (ECC) 328 may detect and correct at least one error that may be included in data read from the semiconductor memory 310. A memory interface (Memory I/F) 330 may interface with the semiconductor memory 310. The central processing unit (CPU) 324 may control data exchange of the memory controller 320 with, for example, the semiconductor memory 310.

If the semiconductor memory 310 is fabricated according to embodiments, capacitors therein can have an improved leakage current characteristic and/or an improved heat-resistant property. Furthermore, the capacitors can have an increased capacitance.

Figure 5B:
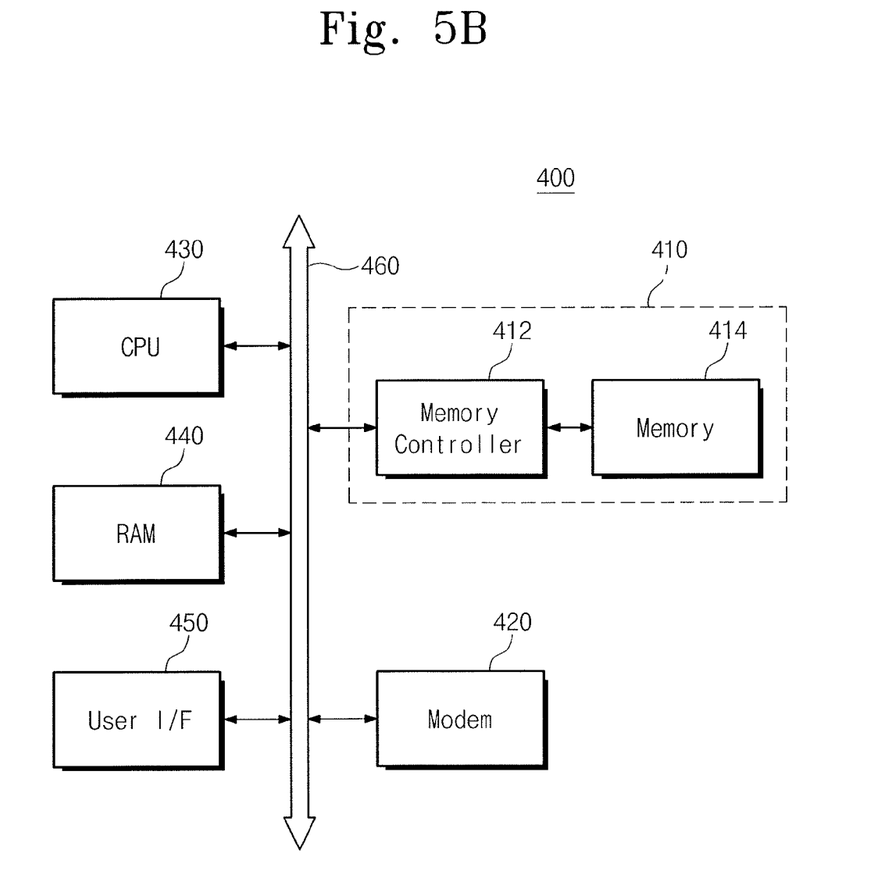
FIG. 5B illustrate a block diagram of an information processing system including a memory device according to exemplary embodiments.

FIG. 5B is a block diagram illustrating an information processing system including a memory device according to exemplary embodiments. Referring to FIG. 5B, an information processing system 400 may include a semiconductor memory device according to exemplary embodiments. The information processing system 400 may include a mobile device or a computer. As an illustration, the information processing system 400 may include a memory system 410, a modem 420, a central processing unit (CPU) 430, a random access memory (RAM) 440, and a user interface (User I/F) 450 that are electrically connected to a system bus 460. The memory system 410 may store data processed by the central processing unit (CPU) 430 and data inputted from the outside (e.g., via the user interface 450 and/or the modem 420). The memory system 410 may include a memory 414 and a memory controller 412. The memory system 410 may be the same as the memory card 300 described with reference to FIG. 5A. The information processing system 400 may be provided as a memory card, a solid state disk, a camera image sensor and an application chip set. For example, the memory system 410 may be a solid state disk (SSD). The information processing system 400 may stably and reliably store data in the memory system 410.

By way of summation and review, with increasing integration density of semiconductor memory devices, the demand for capacitors having a smaller occupying area and a higher capacitance has increased. Since the capacitance is proportional to a dielectric constant of a capacitor dielectric layer, there have been intensive studies on the capacitor dielectric layer.

The embodiments described herein advance the art by providing a capacitor dielectric layer structure that may provide a high dielectric constant and an increased thermal stability. In this regard, a capacitor dielectric layer structure of a capacitor according to example embodiments may include a first dielectric layer with a germanium-doped metal oxide and a second dielectric layer with a silicon-doped metal oxide. A capacitor including such a capacitor dielectric layer may exhibit an improved leakage current characteristic and/or an improved heat-resistant property, and furthermore, the capacitor may have an increased capacitance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor comprising:
   a first electrode;
   a first dielectric layer disposed on the first electrode, the first dielectric layer having a tetragonal crystal structure and including a first metal oxide layer doped with a first impurity;
   a second dielectric layer disposed on the first metal oxide layer, the second dielectric layer having a tetragonal crystal structure and including a second metal oxide layer doped with a second impurity; and
   a second electrode disposed on the second dielectric layer;
   wherein the first dielectric layer has a lower crystallization temperature and a higher dielectric constant than the second dielectric layer.

2. The capacitor as claimed in claim 1, wherein dielectric constants of the first and second dielectric layers are substantially higher than that of silicon oxide.

3. The capacitor as claimed in claim 1, wherein at least one of the first and second dielectric layers includes a portion formed of hafnium oxide.

4. The capacitor as claimed in claim 1, wherein at least one of the first and second dielectric layers includes a portion formed of zirconium oxide.

5. The capacitor as claimed in claim 1, wherein at least one of the first and second dielectric layers includes a portion formed of a mixture of hafnium oxide and zirconium oxide.

6. The capacitor as claimed in claim 1, wherein each of the first and second impurities includes one of silicon (Si), carbon (C), germanium (Ge), tin (Sn), titanium (Ti), and cesium (Ce).

7. The capacitor as claimed in claim 1, wherein a thickness of the second dielectric layer is in a range of about 5 Å to about 25 Å.

8. The capacitor as claimed in claim 1, wherein a ratio in thickness of the first dielectric layer to the second dielectric layer is about 3:1.

9. A semiconductor device, comprising:
   the capacitor as claimed in claim 1;
   a transistor disposed on a substrate, the transistor including a first doped region and a second doped region, the capacitor being electrically connected to the second doped region, and
   a bit line electrically connected to the first doped region.

10. The device as claimed in claim 9, wherein the first impurity includes germanium, the second impurity includes silicon, and the second dielectric layer suppresses a diffusion of the first impurity toward the second electrode.

11. A capacitor, comprising:
    a first electrode and a second electrode facing each other; and
    a dielectric layer structure interposed between the first and second electrodes, the dielectric layer structure including metal oxides doped with different impurities, the metal oxides having different dielectric constants from each other and different crystallization temperatures from each other, wherein
    the dielectric layer structure includes a first dielectric layer that includes hafnium oxide, zirconium oxide or a mixture thereof, and is doped with germanium, and a second dielectric layer that includes hafnium oxide, zirconium oxide or a mixture thereof, and is doped with silicon.

12. The capacitor as claimed in claim 11, wherein a doping amount of germanium in the first dielectric layer is about 20-25 atomic percent.

13. The capacitor as claimed in claim 11, wherein a thickness of the second dielectric layer is in a range of about 5 Å to about 25 Å.

14. The capacitor as claimed in claim 11, wherein a ratio in thickness of the first dielectric layer to the second dielectric layer is about 3:1.

15. The capacitor as claimed in claim 11, wherein the first dielectric layer and the second dielectric layer have a predominantly tetragonal crystal structure.

* * * * *